(12) United States Patent
Ma

(10) Patent No.: US 10,002,558 B2
(45) Date of Patent: Jun. 19, 2018

(54) SHIFT REGISTER UNIT AND DRIVING METHOD THEREOF, GATE DRIVING CIRCUIT, AND DISPLAY DEVICE

(71) Applicant: BOE Technology Group Co., Ltd., Beijing (CN)

(72) Inventor: Zhanjie Ma, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 191 days.

(21) Appl. No.: 15/232,095

(22) Filed: Aug. 9, 2016

(65) Prior Publication Data

US 2017/0278450 A1 Sep. 28, 2017

(30) Foreign Application Priority Data

Mar. 28, 2016 (CN) .......................... 2016 1 0184185

(51) Int. Cl.
*G09G 3/3266* (2016.01)
*G09G 3/20* (2006.01)
*G09G 3/3225* (2016.01)
*G09G 3/36* (2006.01)
*G11C 19/28* (2006.01)

(52) U.S. Cl.
CPC ......... *G09G 3/2092* (2013.01); *G09G 3/3225* (2013.01); *G09G 3/3266* (2013.01); *G09G 3/3648* (2013.01); *G09G 3/3677* (2013.01); *G11C 19/28* (2013.01); *G09G 2310/0286* (2013.01); *G09G 2310/08* (2013.01)

(58) Field of Classification Search
CPC .................... G09G 3/3266; G09G 2310/0286
See application file for complete search history.

(56) References Cited

U.S. PATENT DOCUMENTS

2009/0058790 A1\* 3/2009 Chiang .................. G11C 19/28
345/100

\* cited by examiner

*Primary Examiner* — Dennis Joseph
(74) *Attorney, Agent, or Firm* — Banner & Witcoff, Ltd.

(57) ABSTRACT

Provided are a shift register unit and a driving method thereof, a scan driving circuit, a display device, wherein the shift register unit comprises an input module configured to output a voltage at the signal input terminal to the first node, an energy storage module configured to store the voltage at the first node or to charge the first node, a first pull-up control module configured to output a voltage at the first voltage terminal to the pull-up control node, a second pull-up control module configured to output a voltage at the second voltage terminal to the pull-up control node, a pull-down control module configured to output a voltage at the first node to the pull-down control node. The pulse width of the signal of each stage of output terminal of the GOA circuit can be adjusted.

20 Claims, 4 Drawing Sheets

SHIFT REGISTER UNIT AND DRIVING
METHOD THEREOF, GATE DRIVING
CIRCUIT, AND DISPLAY DEVICE

This application claims priority to and the benefit of Chinese Patent Application No. 201610184185.5 filed on Mar. 28, 2016, which application is incorporated herein in its entirety.

TECHNICAL FIELD

The present disclosure relates to a shift register unit and a driving method thereof, a gate driving circuit, and a display device.

BACKGROUND

Thin Film Transistor Liquid Crystal Display (TFT-LCD) and Active Matrix Driving OLED display devices are more and more applied to the high-performance displaying field due to their characteristics such as small size, low power consumption, no radiation, relatively low production cost, and so on.

The aforesaid display devices are usually provided with a Gate Driver on Array (GOA) circuit, an output terminal in each stage of the GOA circuit being connected to one row of gate lines and used to output a gate scan signal to the gate lines, so as to achieve progressive scanning on the gate lines. However, a pulse width of a signal of the output terminal of the GOA circuit is a fixed value, and the user cannot adjust the pulse width as needed.

SUMMARY

The embodiments of the present disclosure provide a shift register unit and a driving method thereof, a gate driving circuit, and a display device, through which the pulse width of the signal from each stage of output terminals of the GOA circuit can be adjusted.

An aspect of the embodiments of the present disclosure provides a shift register unit, comprising an input module, a first pull-up control module, a second pull-up control module, a pull-down control module, a pull-up module, a pull-down module and an energy storage module.

The input module is connected to a first clock signal terminal, a signal input terminal and a first node, respectively, and is configured to output a voltage at the signal input terminal to the first node under control of the first clock signal terminal.

The first pull-up control module is connected to a first voltage terminal, the first clock signal terminal, a second clock signal terminal, the first node and a pull-up control node, respectively, and is configured to output a voltage at the first voltage terminal to the pull-up control node under control of the first clock signal terminal, the second clock signal terminal and the first node.

The second pull-up control module is connected to a second voltage terminal, the pull-up control node and the first node, respectively, and is configured to output a voltage at the second voltage terminal to the pull-up control node under control of the first node.

The pull-down control module is connected to the second clock signal terminal, the first node and a pull-down control node, respectively, and is configured to output a voltage at the first node to the pull-down control node under control of the second clock signal terminal.

The pull-up module is connected to the pull-up control node, the second voltage terminal and a signal output terminal, respectively, and is configured to output a voltage at the second voltage terminal to the signal output terminal under control of the pull-up control node.

The pull-down module is connected to the pull-down control node, the first voltage terminal and the signal output terminal, respectively, and is configured to output a voltage at the first voltage terminal to the signal output terminal under control of the pull-down control node.

The energy storage module is connected between the first node and the signal output terminal, and is configured to store the voltage at the first node, or to charge the first node.

Further, the first pull-up control module comprises a first transistor, a second transistor, a third transistor, a fourth transistor and a first capacitor. A gate of the first transistor is connected to the first clock signal, and a first electrode thereof is connected to the first voltage terminal, and a second electrode thereof is connected to a gate of the second transistor. A first electrode of the second transistor is connected to the first voltage terminal, and a second electrode thereof is connected to a first electrode of the third transistor. A gate of the third transistor is connected to the second clock signal terminal, and a second electrode thereof is connected to the pull-up control node. A gate of the fourth transistor is connected to the first node, a first electrode thereof is connected to the gate of the second transistor, and a second electrode thereof is connected to the first clock signal terminal. One terminal of the first capacitor is connected to the gate of the second transistor and the other terminal thereof is connected to the gate of the third transistor.

Further, the input module comprises a fifth transistor. A gate of the fifth transistor is connected to the first clock signal terminal, a first electrode thereof is connected to the signal input terminal, and a second electrode thereof is connected to the first node.

Further, the second pull-up control module comprises a sixth transistor. A gate of the sixth transistor is connected to the first node, a first electrode thereof is connected to the second voltage terminal, and a second electrode thereof is connected to the pull-up control node.

Further, the pull-down control module comprises a seventh transistor. A gate of the seventh transistor is connected to the second clock signal terminal, a first electrode thereof is connected to the first node, and a second electrode thereof is connected to the pull-down control node.

Further, the pull-up module comprises an eighth transistor and a third capacitor. A gate of the eighth transistor is connected to the pull-up control node, a first electrode thereof is connected to the second voltage terminal, and a second electrode thereof is connected to the signal output terminal. One terminal of the third capacitor is connected to the second voltage terminal and the other terminal thereof is connected to the gate of the eighth transistor.

Further, the pull-down module comprises a ninth transistor and a fourth capacitor. A gate of the ninth transistor is connected to the pull-down control node, a first electrode thereof is connected to the first voltage terminal, and a second electrode thereof is connected to the signal output terminal. One terminal of the fourth capacitor is connected to the gate of the ninth transistor and the other terminal thereof is connected to the second electrode of the ninth transistor.

Further, the energy storage module comprises a second capacitor. One terminal of the second capacitor is connected to the first node and the other terminal thereof is connected to the signal output terminal.

Another aspect of the present disclosure provides a gate driving circuit comprising at least two cascaded stages of shift register units described above, wherein a signal input terminal of the shift register unit in a first stage is connected to an initial signal terminal; except the shift register unit in the first stage, a signal output terminal of the shift register unit in a previous stage is connected to a signal input terminal of the shift register unit in a next stage.

Yet another aspect of the present disclosure provides a display device comprising the gate driving circuit described above.

Yet another aspect of the present disclosure provides a driving method for the shift register unit described above, within one image frame, the method comprising:

in a first phase, outputting the voltage at the signal input terminal to the first node by the input module under control of the first clock signal terminal, meanwhile storing the voltage at the first node by the energy storage module and storing the voltage at the first voltage terminal by the first pull-up control module, and outputting the voltage at the second voltage terminal to the pull-up control node by the second pull-up control module under the control of the first node, wherein the first pull-up control module, the pull-up module, the pull-down control module, the pull-down module and the signal output terminal output no signals;

in a second phase, outputting the voltage stored by the energy storage module in the first phase to the pull-down control node by the pull-down control module under control of the second clock signal terminal, and outputting the voltage at the first voltage terminal to the signal output terminal by the pull-down module under control of the pull-down control node, and meanwhile storing the voltage at the pull-down control node, wherein the input module, the first pull-up control module, the second pull-up control module and the pull-up module output no signals;

in a third phase, outputting the voltage at the signal input terminal to the first node by the input module under control of the first clock signal terminal, storing the voltage at the first node by the energy storage module voltage, storing the voltage at the first clock signal terminal by the first pull-up voltage control module, the pull-down module being kept in a turned-on state through the voltage stored in the second stage and outputting the voltage at the second voltage terminal to the signal output terminal, wherein the first pull-up control module, the second pull-up control module, the pull-up module and the pull-down control module output no signals;

in a fourth phase, outputting the voltage at the first voltage terminal to the pull-up control node by the first pull-up control module through the voltage stored in the third phase under control of the first clock signal terminal, the second clock signal terminal and the first node so that the pull-up module outputs the voltage at the second voltage terminal to the signal output terminal and the voltage at the pull-up control node is stored, outputting the voltage stored in the third phase to the first node by the energy storage module, outputting the voltage at the first node to the pull-down control node by the pull-down control module and storing the voltage at the pull-down control node, wherein the input module, the second pull-up control module and the pull-down module output no signals;

sequentially repeating control signals of the signal input terminal, the first clock signal terminal and the second clock signal terminal in the third phase and the fourth phase so as to keep the signal output terminal outputting the voltage at the second voltage terminal;

in a fifth phase, outputting the voltage at the signal input terminal to the first node by the input module under control of the first clock signal terminal, meanwhile storing the voltage at the first node by the energy storage module, storing the voltage at the first clock signal terminal by the first pull-up control module, outputting the voltage at the second voltage terminal to the pull-up control node by the second pull-up control module under control of the first node, keeping the signal output terminal outputting the voltage at the second voltage terminal under an action of self-capacitance of signal lines, wherein the first pull-up control module, the pull-up module and the pull-down module output no signals;

in a sixth phase, outputting the voltage stored by the energy storage module in the first phase to the pull-down control node by the pull-down control module under the control of the second clock signal terminal, and outputting the voltage at the first voltage terminal to the signal output terminal by the pull-down module under the control of the pull-down control node, and meanwhile storing the voltage at the pull-down control node, wherein the input module, the first pull-up control module, the second pull-up control module and the pull-up module output no signals; and before a next image frame, repeating control signals of the signal input terminal, the first clock signal terminal and the second clock signal terminal in the fifth phase and the sixth phase so as to keep the signal output terminal outputting the voltage at the first voltage terminal.

The embodiments of the present disclosure provide a shift register unit and a driving method thereof, a gate driving circuit, and a display device, wherein the shift register unit comprises a first pull-up control module, an input module, a second pull-up control module, a pull-down control module, a pull-up module, a pull-down module and an energy storage module. The first pull-up control module is connected respectively to a first voltage terminal, the first clock signal terminal, a second clock signal terminal, the first node and a pull-up control node, and is configured to output a voltage at the first voltage terminal to the pull-up control node under control of the first clock signal terminal and the second clock signal terminal. The input module is connected respectively to a first clock signal terminal, a signal input terminal and a first node, and is configured to output a voltage at the signal input terminal to the first node under control of the first clock signal terminal. The second pull-up control module is connected respectively to a second voltage terminal, the pull-up control node and the first node, and is configured to output a voltage at the second voltage terminal to the pull-up control node under control of the first node. The pull-down control module is connected respectively to the second clock signal terminal, the first node and a pull-down control node, and is configured to output a voltage at the first node to the pull-down control node under control of the second clock signal terminal. The pull-up module is connected respectively to the pull-up control node, the second voltage terminal and a signal output terminal, and is configured to output a voltage at the second voltage terminal to the signal output terminal under control of the pull-up control node. The pull-down module is connected respectively to the pull-down control node, the first voltage terminal and the signal output terminal, and is configured to output a voltage at the first voltage terminal to the signal output terminal under control of the pull-down control node. The energy storage module is connected between the first node and the signal output terminal, and is configured to store the voltage at the first node or to charge the first node.

In this way, the input module can output the signal of the signal input terminal to the first node, and the energy storage module can store the voltage at the first node or provide a stored voltage to the first node. In this case, the first pull-up control module can output the voltage at the first voltage terminal to the pull-up control node under control of the first node, the first clock signal terminal and the second clock signal terminal; the second pull-up control module can output the voltage at the second voltage terminal to the pull-up control node under control of the first node; the pull-down control module can output the voltage at the first node to the pull-down control node under control of the second clock signal. Accordingly, the pull-up control node can control the pull-up module to output the voltage at the second voltage terminal to the signal output terminal, the pull-down control node can control the pull-down module to output the voltage at the first voltage terminal to the signal output terminal, and the voltage at the first voltage terminal and the voltage at the second voltage terminal can decide a pulse width of a signal outputted by the signal output terminal.

To sum up, the input module and the energy storage module can decide a potential at the first node, the first pull-up control module and the second pull-up control module, which are connected to the first node, can control a potential at the pull-down control node, the pull-down module connected to the first node can control a potential at the pull-down control node, and the pull-up control node and the pull-down control node can control a pulse width. In this way, under a corporate action of the input module, the first pull-up control module, the second pull-up control module, the pull-down control module, the pull-up module, the pull-down module and the energy storage module, the pulse width of the output signal of the signal output terminal can be adjusted, so that the pulse width of the output signal of the signal output terminal matches a pulse width of an input signal of the signal input terminal. Thereby, the purpose of adjusting the pulse width of the signal of the signal output terminal of each stage of shift register unit can be achieved by adjusting the pulse width of the signal of the signal input terminal.

REFERENCE SIGNS

101: input module; 102: first pull-up control module; 103: second pull-up control module; 104: pull-down control module; 105: pull-up module; 106: pull-down module; 107: energy storage module; M1: first transistor; M2: second transistor; M3: third transistor; M4: fourth transistor; M5: fifth transistor; M6: sixth transistor; M7: seventh transistor; M8: eighth transistor; M9: ninth transistor; PU: pull-up control node; PD: pull-down control node; NET1: first node; CLK1: first clock signal terminal; CLK2: second clock signal terminal; IN: signal input terminal; OUTPUT: signal output terminal; VGL: first voltage terminal; VGH: second voltage terminal; T1: first time.

DETAILED DESCRIPTION OF THE EMBODIMENTS

Hereinafter, the technical solutions in the embodiments of the present disclosure will be described clearly and comprehensively in combination with the drawings in the embodiments of the present disclosure. Obviously, the described embodiments are only parts of the embodiments of the present disclosure, rather than all of the embodiments thereof.

Figure 1:
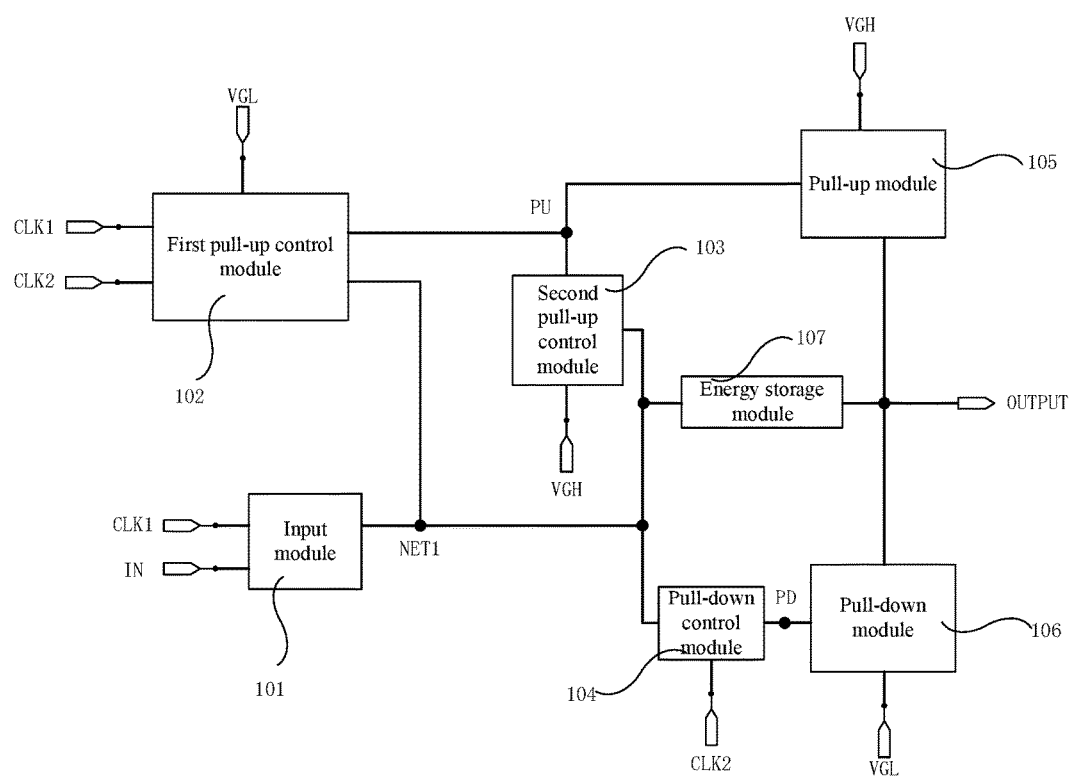
FIG. 1 is a schematic diagram of structure of the shift register unit provided by an embodiment of the present disclosure.

An embodiment of the present disclosure provides a shift register unit. As shown in FIG. 1, the shift register unit may comprise an input module 101, a first pull-up control module 102, a second pull-up control module 103, a pull-down control module 104, a pull-up module 105, a pull-down module 106 and an energy storage module 107.

The input module 101 is connected to a first clock signal terminal CLK1, a signal input terminal IN and a first node NET1, respectively, and is configured to output a voltage at the signal input terminal IN to the first node NET1 under control of the first clock signal terminal CLK1.

The first pull-up control module 102 is connected to a first voltage terminal VGL, the first clock signal terminal CLK1, a second clock signal terminal CLK2, the first node NET1 and a pull-up control node PU, respectively, and is configured to output a voltage at the first voltage terminal VGL to the pull-up control node PU under control of the first clock signal terminal CLK1, the second clock signal terminal CLK2 and the first node NET1.

The second pull-up control module 103 is connected to a second voltage terminal VGH, the pull-up control node PU and the first node NET1, respectively, and is configured to output a voltage at the second voltage terminal VGH to the pull-up control node PU under control of the first node NET.

The pull-down control module 104 is connected to the second clock signal terminal CLK2, the first node NET1 and a pull-down control node PD, respectively, and is configured to output a voltage at the first node NET1 to the pull-down control node PD under control of the second clock signal terminal CLK2.

The pull-up module 105 is connected to the pull-up control node PU, the second voltage terminal VGH and a signal output terminal OUTPUT, respectively, and is configured to output a voltage at the second voltage VGH to the signal output terminal OUTPUT under control of the pull-up control node PU.

The pull-down module 106 is connected to the pull-down control node PD, the first voltage terminal VGL and the signal output terminal OUTPUT, respectively, and is configured to output a voltage at the first voltage terminal VGL to the signal output terminal OUTPUT under control of the pull-down control node PD.

The energy storage module 107 is connected between the first node NET1 and the signal output terminal OUTPUT, and is configured to store the voltage at the first node NET1 or to charge the first node NET1.

In this way, the input module 101 can output the signal of the signal input terminal IN to the first node NET1, and the energy storage module 107 can store the voltage at the first node NET1 or provide a stored voltage to the first node NET1. In this case, the first pull-up control module 102 can output the voltage at the first voltage terminal VGL to the pull-up control node PU under control of the first node NET1, the first clock signal terminal CLK1 and the second clock signal terminal CLK2. The second pull-up control module 103 can output the voltage at the second voltage terminal VGH to the pull-up control node PU under control of the first node NET. The pull-down control module 104 can output the voltage at the first node NET1 to the pull-down control node PD under control of the second clock signal CLK2. Accordingly, the pull-up control node PU can control the pull-up module 105 to output the voltage at the second voltage terminal VGH to the signal output terminal OUTPUT, the pull-down control node PD can control the pull-down module 106 to output the voltage at the first voltage terminal VGL to the signal output terminal OUTPUT, and the voltage at the first voltage terminal VGL and the voltage at the second voltage terminal VGH can decide a pulse width of a signal outputted by the signal output terminal OUTPUT.

In the shift register unit, the input module 101 and the energy storage module 107 can decide a potential at the first node NET1, the first pull-up control module 102 and the second pull-up control module 103, which are connected to the first node NET1, can control a potential at the pull-down control node PU, the pull-down module 106 connected to the first node NET1 can control a potential at the pull-down control node PD, and the pull-up control node PU and the pull-down control node PD can control a pulse width of OUTPUT. In this way, under a corporate action of the input module 101, the first pull-up control module 102, the second pull-up control module 103, the pull-down control module 104, the pull-up module 105, the pull-down module 106 and the energy storage module 107, the pulse width of the output signal of the signal output terminal OUTPUT can be adjusted, so that the pulse width of the output signal of the signal output terminal OUTPUT matches a pulse width of an input signal of the signal input terminal IN. Thereby the purpose of adjusting the pulse width of the output signal of the signal output terminal OUTPUT of each stage of shift register unit can be achieved by adjusting the pulse width of the signal of the signal input terminal IN.

It should be noted that the present disclosure makes no limitations to applications of adjusting the pulse width of the output signal of the signal output terminal OUTPUT of each stage of shift register unit by adjusting the pulse width of the signal of the signal input terminal IN.

For example, when a GOA circuit comprising the shift register unit described above is applied to the OLED display device, gate lines of the display may be scanned progressively by a gate driving circuit comprising cascaded shift register unit described above, so that a pulse width of an output signal can be adjusted by adjusting a pulse width of the signal of the signal input terminal IN of the gate driving circuit, so as to implement control over an effective luminance of the light-emitting diode row by row, and thereby achieve the purpose of adjusting luminance of entire screen.

As another example, when a GOA circuit comprising the shift register unit described above is applied to TFT-LCD, in a case where a size of a TFT-LCD display panel is relatively large, the pulse width of the signal of the signal output terminal OUTPUT of each stage of shift register unit can be increased correspondingly by increasing the pulse width of the signal of the signal input terminal IN, so as to avoid such a phenomena that a pixel cell which is relatively far from the GOA circuit is not sufficiently charged because of a relatively narrow pulse width of the signal of the signal output terminal OUTPUT.

Hereinafter, structures of respective sub-modules in the shift register unit described above will be described in detail through embodiments.

Figure 2:
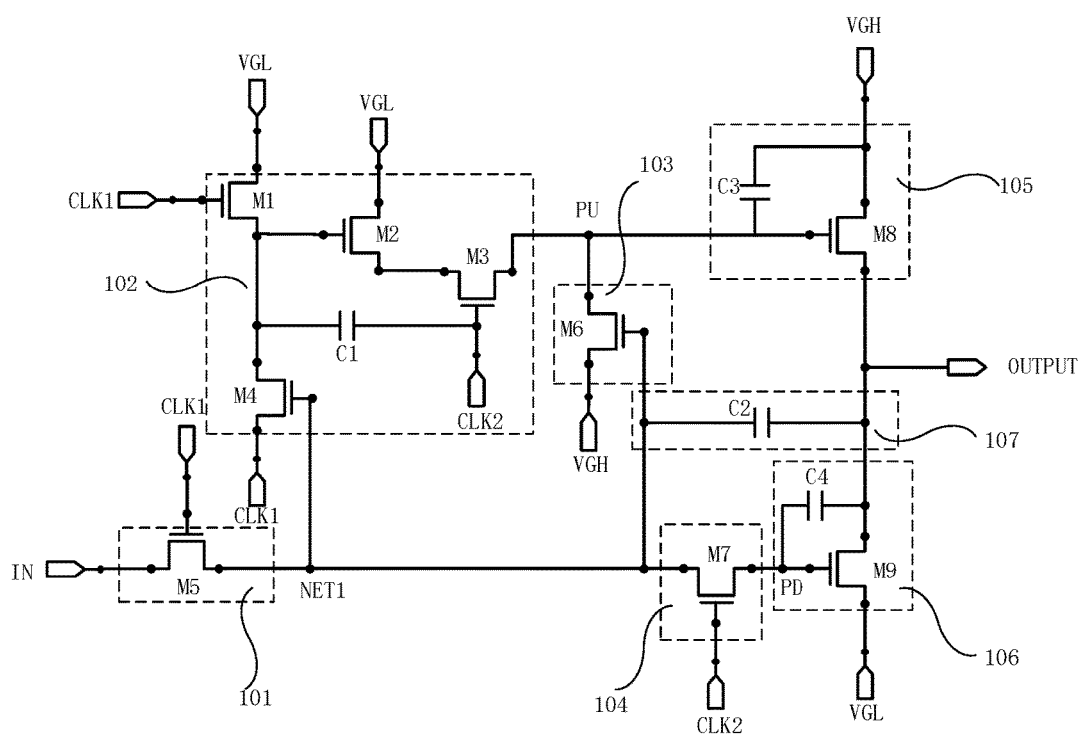
FIG. 2 is a schematic diagram of structure of the shift register unit provided by an embodiment of the present disclosure.

As shown in FIG. 2, the first pull-up control module 102 may comprise a first transistor M1, a second transistor M2, a third transistor M3, a fourth transistor M4 and a first capacitor C1. A gate of the first transistor M1 is connected to the first clock signal CLK1, a first electrode thereof is connected to the first voltage terminal VGL, and a second electrode thereof is connected to a gate of the second transistor M2. A first electrode of the second transistor M2 is connected to the first voltage terminal VGL, and a second gate thereof is connected to a first electrode of the third transistor M3. A gate of the third transistor M3 is connected to the second clock signal terminal CLK2, and a second electrode thereof is connected to the pull-up control node PU. A gate of the fourth transistor M4 is connected to the first node NET1, a first electrode thereof is connected to the gate of the second transistor M2, and a second electrode thereof is connected to the first clock signal terminal CLK1. One terminal of the first capacitor C1 is connected to the gate of the second transistor M2 and the other terminal thereof is connected to the gate of the third transistor M3.

In addition, the input module 101 may comprise a fifth transistor M5. A gate of the fifth transistor M5 is connected to the first clock signal terminal CLK1, a first electrode thereof is connected to the signal input terminal IN, and a second electrode thereof is connected to the first node NET1.

In addition, the second pull-up control module 103 may comprise a sixth transistor M6. A gate of the sixth transistor M6 is connected to the first node NET1, a first electrode thereof is connected to the second voltage terminal VGH, and a second electrode thereof is connected to the pull-up control node PU.

In addition, the pull-down control module 104 may comprise a seventh transistor M7. A gate of the seventh transistor M7 is connected to the second clock signal terminal CLK2, a first electrode thereof is connected to the first node NET, and a second electrode thereof is connected to the pull-down control node PD.

In addition, the pull-up module 105 may comprise an eighth transistor M8 and a third capacitor C3. A gate of the eighth transistor M8 is connected to the pull-up control node PU, a first electrode thereof is connected to the second voltage terminal VGH, and a second electrode thereof is connected to the signal output terminal OUTPUT. One terminal of the third capacitor is connected to the second voltage terminal VGH, and the other terminal thereof is connected to the gate of the eighth transistor M8.

In addition, the pull-down module 106 may comprise a ninth transistor M9 and a fourth capacitor C4. A gate of the ninth transistor M9 is connected to the pull-down control node PD, a first electrode thereof is connected to the first voltage terminal VGL, and a second electrode thereof is connected to the signal output terminal OUTPUT. One terminal of the fourth capacitor C4 is connected to the gate of the ninth transistor M9, and the other terminal thereof is connected to the second electrode of the ninth transistor M9.

In addition, the energy storage module 107 may comprise a second capacitor C2. One terminal of the second capacitor C2 is connected to the first node NET1, and the other terminal thereof is connected to the signal output terminal OUTPUT.

A signal timing diagram of the shift register unit provided by an embodiment of the present disclosure will be described below with reference to FIGS. 3 and 2. It should be noted that, for convenience of explanation, in the following embodiments, the first voltage terminal VGL is inputted with a low level or is grounded, the second voltage terminal VGH is inputted with a high level, and each of the transistors is a P-type transistor. However, the present disclosure is not limited thereto, for example, an N-type transistor may be adopted, and the first voltage terminal may be inputted with a high level, and the second voltage terminal may be inputted with a low level or grounded. Further, for convenience of explanation, "0" indicates a low level and "1" indicates a high level in the following descriptions.

In a first phase S1 within one image frame, IN=0, CLK1=0, CLK2=1.

The first clock signal terminal CLK1 is a low level, the first transistor M1 and the fifth transistor M5 are turned on. The voltage at the signal input terminal IN is outputted to the first node NET1 through the fifth transistor M5, and the voltage at the first node NET1 is stored into the second capacitor C2.

The fourth transistor M4 is turned on under control of the first node NET1. Further, the voltage at the first voltage terminal VGL is outputted to the gate of the second transistor M2 through the first transistor M1, so that the second transistor M2 is turned on, and the capacitor C1 stores the voltage at the first voltage terminal VGL.

The second clock signal terminal CLK2 is a high level, and both the third transistor M3 and the seventh transistor M7 are in a turned-off state. Since the third transistor M3 is turned off, the third transistor M3 outputs no signal to the pull-up control node PU.

The sixth transistor M6 is turned on under control of the low level of the first node NET1, and the voltage at the second voltage terminal VGH is outputted to the pull-up control node PU through the sixth transistor M6. The eighth transistor M8 is turned off under control of the pull-up control node PU, so that the eighth transistor M8 outputs no signal to the signal output terminal OUTPUT.

Since the seventh transistor M7 is turned off, the gate of the ninth transistor M9 has no signal input and is in a turned off state, so that the ninth transistor M9 outputs no signal to the signal output terminal OUTPUT.

Thus, in the first phase S1, the signal output terminal OUTPUT outputs no signal.

In a second phase S2 within the image frame, IN=0, CLK1=1, CLK2=0.

Figure 3:
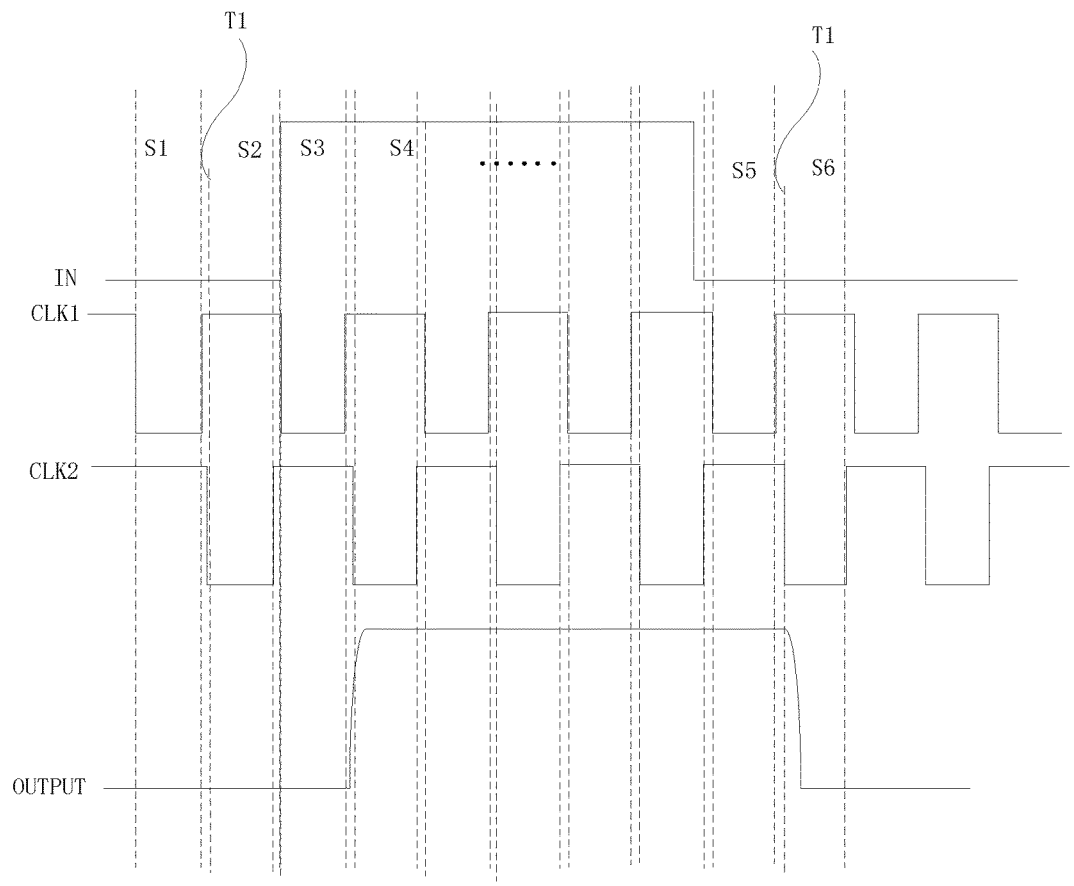
FIG. 3 is a signal timing diagram of the shift register unit provided by an embodiment of the present disclosure.

The first clock signal CLK1 converts into a high level from a low level in the previous phase, the second clock signal CLK2 converts into a low level from a high level in the previous phase, and there is a moment at which the first clock signal terminal CLK1 and the second clock signal terminal CLK2 simultaneously output high levels during the aforesaid conversion process, i.e., first time T1 as shown in FIG. 3. In this case, the second capacitor C2 outputs the low level stored in the previous phase to the first node NET1. The sixth transistor M6 and the fourth transistor M4 are turned on under control of the first node NET1. The voltage at the second voltage terminal VGH is outputted to the pull-up control node PU through the sixth transistor M6, and the voltage at the pull-up control node PU is stored into the third storage capacitor C3. Further, the high level of the first clock signal CLK1 is stored into the first storage capacitor C1 through the fourth transistor M4, meanwhile this high level is inputted to the gate of the second transistor M2, and the second transistor M2 is turned off.

Next, the second clock signal CLK2 is a low level, the first clock signal terminal CLK1 still outputs a high level, and the first transistor M1 and the fifth transistor M5 are turned off. The first capacitor C1 outputs the high level stored at the time T1 to the gate of the second transistor M2, and the second transistor M2 is turned off. Since the fifth transistor M5 is turned off, no signal is outputted to the first node NET1.

The second clock signal terminal CLK2 is a low level, and the third transistor M3 and the seventh transistor M7 are turned on. Since the second transistor M2 is turned off, no signal is outputted to the pull-up control node PU through the third transistor M3.

In addition, the second capacitor C2 outputs the low level stored in the previous phase to the first node NET1, and the fourth transistor M4 and the sixth transistor M6 are turned on under control of the low level of the first node NET1. The high level outputted by the first clock signal terminal CLK is stored into the first storage capacitor C1 through the fourth transistor M4. Further, the voltage at the second voltage terminal VGH is output to the gate of the eighth transistor M8 through the sixth transistor M6, meanwhile the third capacitor C3 also outputs the high level stored at the first time T1 to the gate of the eighth transistor M8. The eighth transistor M8 remains turned off, and no signal is outputted to the signal output terminal OUTPUT.

Since the seventh transistor M7 is turned on, the second capacitor C2 stores the low level stored in the previous phase into the fourth storage capacitor C4 through the seventh transistor M7, and meanwhile to the gate of the ninth transistor M9. The ninth transistor M9 is turned on, the voltage at the first voltage terminal VGL is output to the signal output terminal OUTPUT through the ninth transistor M9.

Thus, in the second phase S2, the signal output terminal OUTPUT outputs a low level.

Herein, it should be noted that, in the second phase S2 described above, the second capacitor C2 stores the low level stored in the previous phase into the fourth storage capacitor C4 through the pull-down control node PD. Thus, capacitance of the second capacitor C2 is disposed to be larger than that of the fourth capacitor C4, to ensure that the potential of the pull-down control node PD is as close to the low level in the second capacitor C2 as possible, and the fourth capacitor C4 can be sufficiently charged to maintain a normal output in the next phase.

In a third phase S3 within the image frame, IN=1, CLK1=0, CLK2=1.

The first clock signal terminal CLK1 is a low level, the first transistor M1 and the fifth transistor M5 are turned on. The voltage at the signal input terminal IN is outputted to the first node NET1 through the fifth transistor M5, and the voltage at the first node NET1 is stored into the second capacitor C2. The voltage at the first voltage terminal VGL is outputted to the gate of the second transistor M2 through the first transistor M1, the second transistor M2 is turned on, and the voltage at the first voltage terminal VGL is stored through the first capacitor C1.

In addition, both the fourth transistor M4 and the sixth transistor M6 are in a turned-off state under control of the first node NET1. Thus, the gate of the eighth transistor M8 has no signal input, the eighth transistor M8 is in a turned-off state, and no signal is outputted to the signal output terminal OUTPUT.

The second clock signal terminal CLK2 is a high level, and both the third transistor M3 and the seventh transistor M7 are in a turned-off state. Since the third transistor M3 is turned off, the first pull-up control module 102 outputs no signal to the pull-up control node PU. Since the seventh transistor M7 is turned off, the gate of the ninth transistor M9 has no signal input and is in a turned-off state, and no signal is outputted to the signal output terminal OUTPUT.

The fourth capacitor C4 outputs the low level stored in the previous phase to the gate of the ninth transistor M9 through the pull-down control node PD. The ninth transistor M9 is turned on, the voltage at the first voltage terminal VGL is outputted to the signal output terminal OUTPUT through the ninth transistor M9.

Thus, in the third phase S3, the signal output terminal OUTPUT outputs a low level.

In a fourth phase S4 within the image frame, IN=1, CLK1=1, CLK2=0.

The first clock signal terminal CLK1 is a high level, and the first transistor M1 and the fifth transistor M5 are turned off.

The second clock signal terminal CLK2 is a low level, and the third transistor M3 and the seventh transistor M7 are turned on. The first capacitor C1 outputs the low level stored in the previous phase to the gate of the second transistor M2. The second transistor M2 is turned on, so that the voltage at the first voltage terminal VGL is outputted to the pull-up control node PU through the third transistor M3. The eighth transistor M8 is turned on under control of pull-up control node PU, so that the voltage at the second voltage terminal VGH is outputted to the signal output terminal OUTPUT, and meanwhile the low level of the pull-up control node PU is stored into the third storage capacitor C3.

The second capacitor C2 outputs the high level stored in the third phase S3 to the first node NET1. The sixth transistor M6 is turned off under control of the high level of the first node NET1, and no signal is outputted to the pull-up control node PU.

In addition, the seventh transistor M7 is turned on. Under control of the high level of the first node NET1, signal is output to the pull-down control node PD through the seventh transistor M7. The ninth transistor M9 is turned off under control of the pull-down control node PD, and no signal is outputted to the signal output terminal OUTPUT, and meanwhile the voltage at the pull-down control node PD voltage is stored into the fourth storage capacitor C4.

Meanwhile, the fourth transistor M4 is turned off under control of the high level stored in the second capacitor C2 in the previous phase.

Thus, in the fourth phase S4, the signal output terminal OUTPUT outputs a high level.

Next, control signals of the signal input terminal IN, the first clock signal terminal CLK1 and the second clock signal terminal CLK2 in the third phase S3 and the fourth phase S4 are repeated sequentially, so that the signal output terminal OUTPUT keeps outputting the voltage at the second voltage terminal VGH, i.e., keeps a high level output.

In a fifth phase S5 within the image frame, IN=0, CLK1=0, CLK2=1.

The first clock signal terminal CLK1 is a low level, and the first transistor M1 and the fifth transistor M5 are turned on. The voltage at the signal input terminal IN is outputted to the first node NET1 through the fifth transistor M5, and the voltage at the first node NET1 is stored into the second capacitor C2.

The fourth transistor M4 is turned on under control of the first node NET1. Further, the voltage at the first voltage terminal VGL is outputted to the gate of the second transistor M2 through the first transistor M1, the second transistor M2 is turned on, and the voltage at the first voltage stored voltage terminal VGL is stored through the first capacitor C1.

The second clock signal terminal CLK2 is a high level, and both the third transistor M3 and the seventh transistor M7 are in a turned-off state. Since the third transistor M3 is turned off, no signal is inputted to the pull-up control node PU.

The sixth transistor M6 is turned on under control of the low level at the first node NET1. The voltage at the second voltage terminal VGH is outputted to the pull-up control node PU through the sixth transistor M6. The eighth transistor M8 is in a turned-off state under control of the pull-up control node PU, and no signal is outputted to the signal output terminal OUTPUT.

Since the seventh transistor M7 is turned off, the gate of the ninth transistor M9 has no signal input and is turned off, and no signal is outputted to the signal output terminal OUTPUT.

At this time, under an action of self-capacitance of signal lines, the signal output terminal OUTPUT keeps outputting the voltage at the second voltage terminal VGH.

Thus, in the fifth phase S5, the signal output terminal OUTPUT keeps outputting a high level.

In a sixth phase S6 within the image frame, IN=0, CLK1=1, CLK2=0.

The sixth phase S6 is substantially the same with the second phase S2 in terms of states of signals inputted to the signal input terminal IN, the first clock signal terminal CLK1 and the second clock signal terminal CLK, the turned-on/turned-off state of respective transistors, charging and discharging state of respective capacitors and output signals of the signal output terminal OUTPUT. That is, the process of the sixth phase S6 is substantially the same as that of the second phase S2, and the signal output terminal OUTPUT also outputs a low level in this phase. Therefore, descriptions with regard to the second phase S2 can be consulted, no more details repeated here.

Herein, it should be noted that, since at the first time T1 in either the second phase S2 or the sixth phase S6 (i.e., the moment at which the first clock signal terminal CLK1 and the second clock signal terminal CLK2 simultaneously output high levels), the second capacitor C2 outputs the low level stored in the previous phase, the sixth transistor M6 and the fourth transistor M4 are turned on, so that the high level of the first clock signal CLK1 and the high level of the second clock signal CLK2 are stored into the first storage capacitor C1 and the third capacitance C3, respectively, thereby it is ensured that when the second clock signal CLK2 is a low level, both the second transistor M2 and the eighth transistor M8 are in a turned-off state, the voltage at the first voltage terminal VGL can be output to the signal output terminal OUTPUT through the ninth transistor M9, i.e., it is ensured that a low level can be outputted in the phase.

In addition, the time T1 also exists in the phases other than the second stage S2 and the sixth stage S6. However, in these stages, the first time T1 will not have a decisive impact on outputting a high level by the signal output terminal OUT- PUT, thus the present disclosure does not explain in detail the turned-on/turned-off state of the respective transistors at the time T1 in these phases.

Next, before a next image frame, control signals of the signal input terminal IN, the first clock signal terminal CLK1 and the second clock signal terminal CLK2 in the fifth phase S5 and the sixth phase S6 may be repeated, so that the signal output terminal OUTPUT keeps outputting the voltage at the first voltage terminal VGL.

It should be noted that the turned-on/turned-off of the transistors in the above-described embodiments are described with each of the transistors being a P-type transistor as an example. Optionally, each of the transistors may be an N-type transistor. Accordingly, a level of each signal in FIG. 3 may be inverted as needed, modules and transistors connected to the first voltage terminal VGL in FIGS. 1 and 2 may be connected to the second voltage terminal VGH, and modules and transistors connected to the second voltage terminal VGH may be connected to the first voltage terminal VGL.

Figure 4:
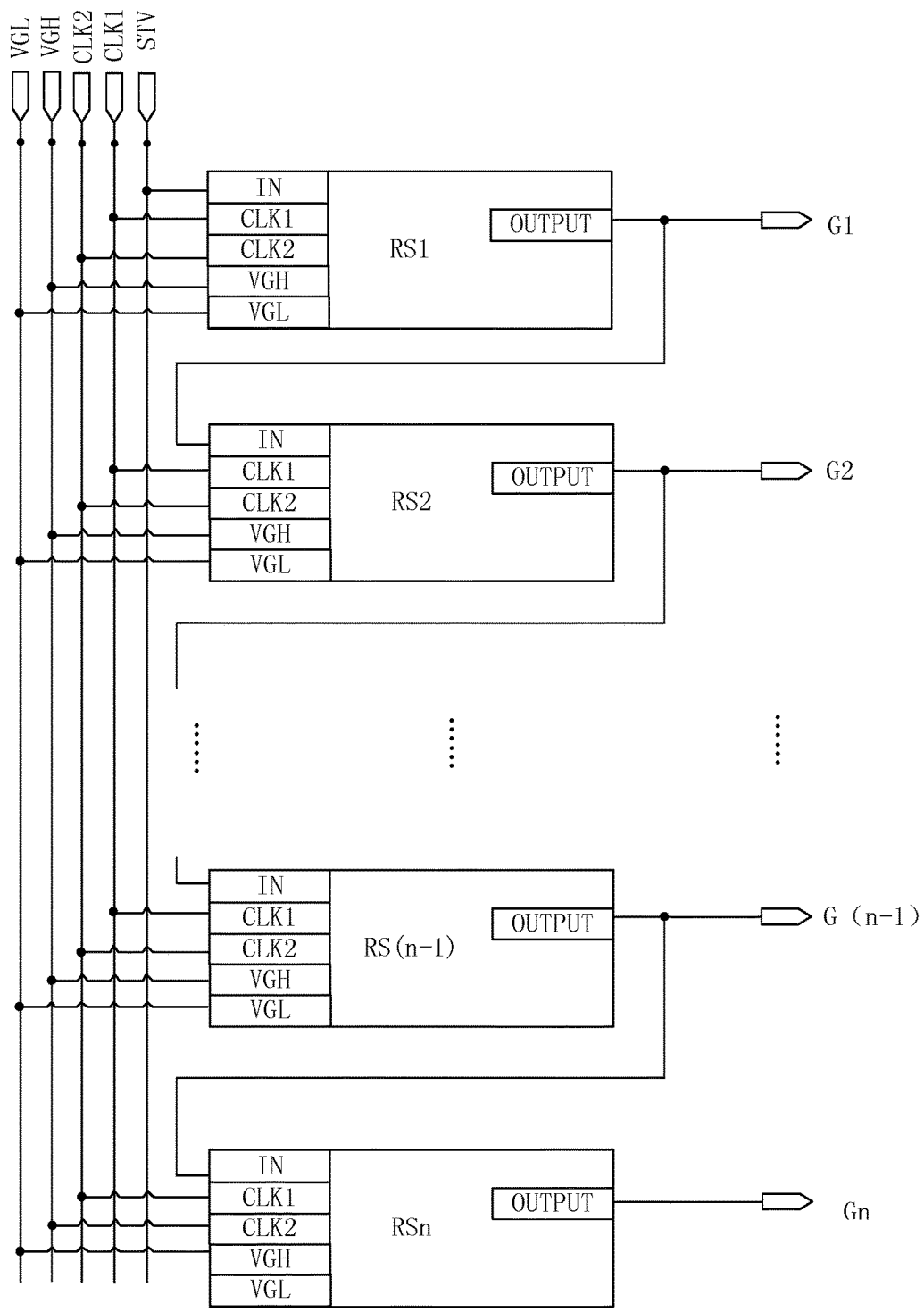
FIG. 4 is a schematic diagram of structure of the gate driving circuit provided by an embodiment of the present disclosure.

An embodiment of the present disclosure further provides a gate driving circuit. As shown in FIG. 4, the gate driving circuit comprises at least two cascaded of any of the above-described shift register unit, with the same structures and advantageous effects as those of the shift register unit in the above embodiments. Since the structures and advantageous effects of the shift register unit have already been described in detail in the preceding embodiments, no more details repeated here.

In the gate driving circuit, a signal input terminal IN of the shift register unit RS1 in a first stage is connected to an initial signal terminal STV, wherein the initial signal terminal STV is configured to input an initial signal. Except the first stage of shift register unit RS1, a signal output terminal OUTPUT of the shift register unit RS (n−1) in a previous stage is connected to a signal input terminal IN of the shift register unit RSn in a next stage. The first stage of shift register unit RS1 of the gate driving circuit starts to scan the gate lines progressively after receiving the initial signal.

An embodiment of the present disclosure further provides a display device comprising the gate driving circuit described above, with the same structures and advantageous effects as those of the gate driving circuit in the above embodiments. Since the structures and advantageous effects of the gate driving circuit have already been described in detail in the preceding embodiments, no more details repeated here.

It should be noted that, in the embodiments of the present disclosure, the display device may include at least a liquid crystal display panel and an organic light emitting diode display panel. Said display panel may be applied to any product or component having a display function, like a liquid crystal display, a liquid crystal television, a digital photo frame, a mobile phone, or a tablet computer.

In addition, an embodiment of the present disclosure further provides a method for driving any of the shift register unit described above. Within one picture frame, the method may comprise a first phase S1, a second phase S2, a third phase S3, a fourth phase S4, a fifth phase S5 and a sixth phase S6.

In the first phase S1, the input module 101 outputs the voltage at the signal input terminal IN to the first node NET1 under control of the first clock signal terminal CLK1, and meanwhile the energy storage module 107 stores the voltage at the first node NET1. The first pull-up control module 102 stores the voltage at the first voltage terminal VGL. The second pull-up control module 103 outputs the voltage at the second voltage terminal VGH to the pull-up control node PU under the control of the first node NET1. In this phase, the first pull-up control module 102, the pull-up module 105, the pull-down control module 104, the pull-down module 106 and the signal output terminal output no signals.

For the shift register unit as shown in FIG. 2, in the first phase S1, the first clock signal terminal CLK1 is a low level, the fifth transistor M5 in the input module 101 is turned on, the voltage at the signal input terminal IN is outputted to the first node NET1, and meanwhile the second capacitor C2 in the energy storage module 107 stores the voltage at the first node NET1.

The first clock signal terminal CLK1 is a low level, the first transistor M1 in the first pull-up control module 102 is turned on, and the voltage at the first voltage terminal VGL is stored into the first capacitor C1; meanwhile the second clock signal terminal CLK2 is a high level, the third transistor M3 in the first pull-up control module 102 is turned off, so that the first pull-up control module 102 outputs no signal to the pull-up control node PU.

The sixth transistor M6 in the second pull-up control module 103 is turned on under control of the low level of the first node NET1, and the voltage at the second voltage terminal VGH is outputted to the pull-up control node PU.

The eighth transistor M8 in the pull-up module 105 is in a turned-off state under control of the high level of the pull-up control mode PU, and no signal is outputted to the signal output terminal OUTPUT.

The second clock signal terminal CLK2 is a high level, the seventh transistor M7 in the pull-down control module 104 turns off, so that no signal is inputted to the gate of the ninth transistor M9 in the pull-down module 106, the ninth transistor M9 is in a turned-off state, and no signal is outputted to the signal output terminal OUTPUT.

Thus, in the first phase S1, the signal output terminal OUTPUT outputs no signal.

In the second phase S2, the pull-down control module 104 outputs the voltage stored by the energy storage module 107 in the first phase to the pull-down control node PD under control of the second clock signal terminal CLK2. The pull-down module 106 outputs the voltage at the first voltage terminal VGL to the signal output terminal OUTPUT under control of the pull-down control node PD, and meanwhile the voltage at the pull-down control node PD is stored.

It this phase, the input module 101, the first pull-up control module 102, the second pull-up control module 103 and the pull-up module 105 output no signals.

For the shift register unit as shown in FIG. 2, in the second phase S2, the first clock signal terminal CLK1 is a high level, the fifth transistor M5 in the input module 101 is turned off, and no signal is inputted to the first node NET1, so that the sixth transistor M6 in the second pull-up control module 103 is turned off, and no signal is inputted to the pull-up control node PU.

In this phase, there is a moment at which the first clock signal terminal CLK1 and the second clock signal terminal CLK2 simultaneously output high levels, i.e., first time T1 as shown in FIG. 3. In this case, the low level stored in the previous phase is output to the first node NET1 by the second capacitor C1. The fourth transistor M4 in the first pull-up control module 102 is turned on under control of the first node NET1, and the high level of first clock signal terminal CLK1 is stored into the first storage capacitor C1. Meanwhile, the sixth transistor M6 in the second pull-up control module 103 is turned on under control of the first node NET1, and the high level of the second voltage terminal VGH is stored into the third capacitor C3.

When the second clock signal terminal CLK2 is a low level, the first transistor M1 in the first pull-up control module 102 is turned off, the third transistor M3 is turned on, the first capacitor C1 outputs the high level stored at the first time T1 to the gate of the second transistor M2, and the second transistor M2 is turned off, so that the first pull-up control module 102 outputs no signal to the pull-up control node PU. Meanwhile, the high level stored by the third capacitor C3 at the first time T1 is outputted to the gate of the eighth transistor M8, so that the pull-up module 105 outputs no signal to the signal output terminal OUTPUT.

When the second clock signal terminal CLK2 is a low level, the seventh transistor M7 in the pull-down control module 104 is turned on, and the low level stored in the previous phase is output to the pull-down control PD by the second capacitor C2 in the energy storage module 107. The pull-down ninth transistor M9 in control module 106 is turned on under control of the low level of the pull-down control node PD, and the voltage at the first voltage terminal VGL is outputted to the signal output terminal OUTPUT, and meanwhile the voltage at the pull-down control node PD is stored into the fourth capacitor C4.

Thus, in the second phase S2, the signal output terminal OUTPUT outputs a low level.

In the third phase S3, the input module 107 outputs the voltage at the signal input terminal IN to the first node NET1 under control of the first clock signal terminal CLK1, and the energy storage module voltage 107 stores the voltage at the first node NET1. The first pull-up voltage control module 102 stores the voltage at the first clock signal terminal CLK1. The pull-down module 106 remains a turned-on state through the voltage stored in the second phase, and outputs the voltage at the second voltage terminal VGH to the signal output terminal OUTPUT.

In this phase, the first pull-up control module 102, the second pull-up control module 103, the pull-up module 105 and the pull-down control module 104 output no signals.

For the shift register unit as shown in FIG. 2, in the third phase S3, the first clock signal terminal CLK1 is a low level, the fifth transistor M5 in the input module 101 is turned on, the high level of the signal input terminal IN is outputted to the first node NET1, and the second capacitor C2 in the energy storage module 107 stores the high level of the first node NET1. Further, the sixth transistor M6 in the second pull-up control module 103 is turned off under control of the high level of the first node NET1, and no signal is outputted to the pull-up control node PU.

The first clock signal terminal CLK1 is a low level, the first transistor M1 is turned on, the second clock signal terminal CLK2 is a high level, and the third transistor M3 is turned off, so that the first pull-up control module 102 outputs no signal to the pull-up control node PU, which in turn causes the eighth transistor M8 in the pull-up module 105 to be turned off, and no signal to be outputted to the signal output terminal OUTPUT. Meanwhile, the first transistor M1 in the first pull-up control module 102 is turned on, and the voltage at the first clock signal terminal CLK1 is outputted to the first capacitor C1.

The second clock signal terminal CLK2 is a high level, the seventh transistor M7 in the pull-down control module 104 is turned off, and no signal is outputted to the pull-down control node PD.

The fourth capacitor C4 in the pull-down module 106 outputs the low level stored in the previous phase to the gate of the ninth transistor M9 through the pull-down control node PD. The ninth transistor M9 is turned on, and the voltage at the first voltage terminal VGL is outputted to the signal output terminal OUTPUT.

Thus, in the third phase S3, the signal output terminal OUTPUT outputs a low level.

In the fourth phase S4, the first pull-up control module 102 outputs the voltage at the first voltage terminal VGL to the pull-up control node PU through the voltage stored in the third phase S3 under control of the first clock signal terminal CLK1, the second clock signal terminal CLK2 and the first node NET1, so that the pull-up module 105 outputs the voltage at the second voltage terminal VGH to the signal output terminal OUTPUT, and stores the voltage at the pull-up control node PU.

The energy storage module 107 outputs the voltage stored in the third phase S3 to the first node NET1. The pull-down control module 106 outputs the voltage at the first node NET1 to the pull-down control node PD, and stores the voltage at the pull-down control node PD.

In this phase, the input module 101, the second pull-up control module 103 and the pull-down module 106 output no signals.

For the shift register unit as shown in FIG. 2, in the fourth phase S4, the first clock signal terminal CLK1 is a high level, the fifth transistor M5 in the input module 101 is turned off, and no signal is outputted to the first node NET1.

The second clock signal terminal CLK2 is a low level, the third transistor M3 is turned on, meanwhile the first capacitor C1 outputs the low level stored in the previous phase to the gate of the second transistor M2, the second transistor M2 is turned on, and the voltage at the first voltage terminal VGL is outputted to the pull-up control node PU through the third transistor M3, the eighth transistor M8 in the pull-up control node PU is turned on under control of the low level of the pull-up control node PU, and the voltage at the second voltage terminal voltage VGH is outputted to the signal output terminal OUTPUT, and meanwhile the low level of the pull-up control node PU is stored into the third storage capacitor C3.

In addition, the second capacitor C2 in the energy storage module 107 outputs the high level stored in the third phase S3 to the first node NET1; the sixth transistor M6 in the second pull-up control module 103 is turned off under control of the high level of the control node NET1, and no signal is outputted to the pull-up control node PU.

In addition, the second clock signal terminal CLK2 is a low level, the seventh transistor M7 in the pull-down control module 106 is turned on, and the high level of the first node NET1 is output to the pull-down control node PD through the seventh transistor M7, the pull-down ninth transistor M9 in the control module 106 is turned off under control of the high level of the pull-down control node PD, and outputs no signal to the signal output terminal OUTPUT, and meanwhile the high level of the pull-down control node PD is stored into the fourth capacitor C4.

Thus, in the fourth phase S4, the signal output terminal OUTPUT outputs a high level.

Next, control signals of the signal input terminal IN, the first clock signal terminal CLK1 and the second clock signal terminal CLK2 in the third phase S3 and the fourth phase S4 may be repeated sequentially, so that the signal output terminal OUTPUT keeps outputting the voltage at the second voltage terminal VGH.

Herein it should be noted that, in the process of repeating the third phase S3, the input signals are completely identical to those in the third phase S4, but in the fourth phase S4, the third capacitor C3 stores a low level, and thus the eighth transistor M8 can be kept being turned on; further, the fourth capacitor C4 stores a high level, so that the ninth transistor M9 is turned off, which thereby enables the voltage at the second voltage terminal VGH can be output to the signal output terminal OUTPUT through the eighth transistor M8. Thus, although the input signals in the third phase S3 are repeated, the low level output signal in the third phase S3 is not repeated, instead, a continuous output of a high level signal is kept.

In the fifth phase S5, the input module 107 outputs the voltage at the signal input terminal IN to the first node NET1 under control of the first clock signal terminal CLK1; meanwhile the energy storage module 107 stores the voltage at the first node NET1.

The first pull-up control module 102 stores the voltage at the first clock signal terminal CLK1. The second pull-up control module 103 outputs the voltage at the second voltage terminal VGH to the pull-up control node PU under control of the first node NET1. Under an action of self-capacitance of signal lines, the signal output terminal OUTPUT keeps outputting the voltage at the second voltage terminal VGH.

In this phase, the first pull-up control module 103, the pull-up module 105 and pull-down module 106 outputs no signals.

For the shift register unit as shown in FIG. 2, in the fifth phase S5, the first clock signal terminal CLK1 is a low level, the fifth transistor M5 in the input module 101 is turned on, and the voltage at the signal input terminal IN is outputted to the first node NET1. Meanwhile, the second capacitor C2 in the energy storage module 107 stores the voltage at the first node NET1.

In addition, the first clock signal terminal CLK1 is a low level, the first transistor M1 in the pull-up control module 102 is turned on, and the voltage at the first voltage terminal VGL is stored into the first capacitor C1; meanwhile, the second clock signal terminal CLK2 is a high level, the third transistor M3 in the first pull-up control module 102 is turned off, so that the first pull-up control module 102 outputs no signal to the pull-up control node PU.

The sixth transistor M6 in the second pull-up control module 102 is turned on under control of the low level of the first node NET1, and the voltage at the second voltage terminal VGH is outputted to the pull-up control node PU. The eighth transistor M8 in the pull-up module 105 is turned off under control of the high level of the pull-up control node PU, and no signal is outputted to the signal output terminal OUTPUT.

The second clock signal terminal CLK2 is a high level, the seventh transistor M7 in the pull-down control module 104 turns off, so that no signal is inputted to the gate of the ninth transistor M9 in the pull-down module 106, the ninth transistor M9 is in a turned-off state, and no signal is outputted to the signal output terminal OUTPUT.

Thus, in the fifth phase S5, under an action of self-capacitance of signal lines, the signal output terminal OUTPUT outputs a high level.

In the sixth phase S6, the pull-down control module 104 outputs the voltage stored by the energy storage module 107 in the previous phase to the pull-down control node PD under the control of the second clock signal terminal CLK2, and the pull-down module 106 outputs the voltage at the first voltage terminal VGL to the signal output terminal OUTPUT under the control of the pull-down control node PD, and meanwhile the voltage at the pull-down control node PD is stored.

In this phase, the input module 101, the first pull-up control module 102, the second pull-up control module 103 and the pull-up module 105 output no signals.

For the shift register unit as shown in FIG. 2, in the sixth phase S6, the first clock signal terminal CLK1 is a high level, the fifth transistor M5 in the input module 101 is turned off and no signal is input to the first node NET1, so that the sixth transistor M6 in the second pull-up control module 103 is turned off and no signal is input to the pull-up control node PU.

Like the first time T1 in the second phase S2, the fourth transistor M4 and the sixth transistor M6 can be turned on through the low level stored by the capacitor C2 in the previous phase. The high level of the first clock signal CLK1 is stored into the first storage capacitor C1 through the fourth transistor M4, and the high level of the second high level voltage terminal VGH is stored into the third storage capacitor C3 through the sixth transistor M6.

When the second clock signal terminal CLK2 is a low level, the first transistor M1 in the first pull-up control module 102 is turned off, the third transistor M3 in the first pull-up control module 102 is turned on, the first capacitor C1 outputs the high level stored at the first time T1 to the gate of the second transistor M2. The second transistor M2 is turned off, so that the first pull-up control module 102 outputs no signal to the pull-up control node PU. Meanwhile, the high level stored in the third capacitor C3 at the first time T1 is outputted to the gate of the eighth transistor M8, so that the pull-up module 105 outputs no signal to the signal output terminal OUTPUT.

In addition, the second clock signal terminal CLK2 is a low level, the seventh transistor M7 in the pull-down control module 104 is turned on, and the low level stored by the second capacitor C2 in the energy storage module 107 in the previous phase is outputted to the pull-down control node PD. The ninth transistor M9 in the pull-down module 106 is turned on under control of the low level of the pull-down control node PD, and the voltage at the first voltage terminal VGL is outputted to the signal output terminal OUTPUT, meanwhile, the voltage at the pull-down control node PD is stored into the fourth capacitor C4.

Thus, in the sixth phase S6, the signal output terminal OUTPUT outputs a low level.

Thereafter, before a next image frame, control signals of the signal input terminal IN, the first clock signal terminal CLK1 and the second clock signal terminal CLK2 in the fifth phase S5 and the sixth phase S6 are repeated, so that the signal output terminal OUTPUT keeps outputting the voltage at the first voltage terminal VGL.

It should be noted that, operating process of the shift register unit in the next image frame is similar to the process described above, including the first stage S1 to the sixth stage S6 described above. When it needs to increase an output pulse width of the shift register unit in the next phase, the control signals in the third phase S3 and the fourth phase S4 may be repeated after the fourth phase S4, so that the signal output terminal OUTPUT keeps outputting a high level, so as to achieve the purpose of increasing a pulse width of an output signal of the signal output terminal OUTPUT. Of course, the embodiments described above merely describe the adjustment performed at the time of increasing the pulse width at the signal output terminal OUTPUT, but the present disclosure is not limited thereto. For example, when it needs to reduce a pulse width at the signal output terminal OUTPUT, the number of times of repeating the third phase S3 and the fourth phase S4 may be reduced after the fourth phase S4.

In addition, through the process of the first phase S1 to the sixth phase S6, the shift register unit described above can achieve an even multiple of the pulse width, so that the shift register unit can achieve an application of the even multiple of the pulse width. Herein, it should be noted that the even multiple of the pulse width refers to that a time duration during which the signal output terminal OUTPUT outputs a high level is an even multiple of the pulse width of a square wave of the first clock signal CLK1 or of the second clock signal terminal CKL2.

Some embodiments of the present disclosure have been described. However, the present disclosure is limited thereto, and all of the modifications or replacements that are easily conceivable for those skilled in the art within the technique range disclosed in the present disclosure should fall into the spirit and protection scope of the present disclosure.

The present application claims priority right of Chinese Patent Application No. 201610184185.5 filed on Mar. 28, 2016, the disclosure of which is incorporated in entirety herein by reference as a portion of the present application.

What is claimed is:

1. A shift register unit, comprising:
an input module connected to a first clock signal terminal, a signal input terminal and a first node, and configured to output a voltage at the signal input terminal to the first node under control of the first clock signal terminal;
a first pull-up control module connected to a first voltage terminal, the first clock signal terminal, a second clock signal terminal, the first node and a pull-up control node, and configured to output a voltage at the first voltage terminal to the pull-up control node under control of the first clock signal terminal, the second clock signal terminal and the first node;
a second pull-up control module connected to a second voltage terminal, the pull-up control node and the first node, and configured to output a voltage at the second voltage terminal to the pull-up control node under control of the first node;
a pull-down control module connected to the second clock signal terminal, the first node and a pull-down control node, and configured to output a voltage at the first node to the pull-down control node under control of the second clock signal terminal;
a pull-up module connected to the pull-up control node, the second voltage terminal and a signal output terminal, and configured to output a voltage at the second voltage terminal to the signal output terminal under control of the pull-up control node;
a pull-down module connected to the pull-down control node, the first voltage terminal and the signal output terminal, and configured to output a voltage at the first voltage terminal to the signal output terminal under control of the pull-down control node; and
an energy storage module connected between the first node and the signal output terminal, and configured to store the voltage at the first node or to charge the first node.

2. The shift register unit according to claim 1, wherein the first pull-up control module comprises:
a first transistor having a gate connected to the first clock signal, and a first electrode connected to the first voltage terminal;
a second transistor having a gate connected to a second electrode of the first transistor, and a first electrode connected to the first voltage terminal;
a third transistor having a gate connected to the second clock signal terminal, a first electrode connected to a second electrode of the second transistor, and a second electrode connected to the pull-up control node;
a fourth transistor having a gate connected to the first node, a first electrode connected to the gate of the second transistor, and a second electrode connected to the first clock signal terminal; and
a first capacitor having one terminal connected to the gate of the second transistor and the other terminal connected to the gate of the third transistor.

3. The shift register unit according to claim 1, wherein the input module comprises:
a fifth transistor having a gate connected to the first clock signal terminal, a first electrode connected to the signal input terminal, and a second electrode connected to the first node.

4. The shift register unit according to claim 1, wherein the second pull-up control module comprises:
a sixth transistor having a gate connected to the first node, a first electrode connected to the second voltage terminal, and a second electrode connected to the pull-up control node.

5. The shift register unit according to claim 1, wherein the pull-down control module comprises:
a seventh transistor having a gate connected to the second clock signal terminal, a first electrode connected to the first node, and a second electrode connected to the pull-down control node.

6. The shift register unit according to claim 1, wherein the pull-up module comprises:
an eighth transistor having a gate connected to the pull-up control node, a first electrode connected to the second voltage terminal, and a second electrode connected to the signal output terminal; and
a third capacitor having one terminal connected to the second voltage terminal and the other terminal connected to the gate of the eighth transistor.

7. The shift register unit according to claim 1, wherein the pull-down module comprises:
a ninth transistor having a gate connected to the pull-down control node, a first electrode connected to the first voltage terminal, and a second electrode connected to the signal output terminal; and
a fourth capacitor having one terminal connected to the gate of the ninth transistor and the other terminal connected to the second electrode of the ninth transistor.

8. The shift register unit according to claim 1, wherein the energy storage module comprises:
a second capacitor having one terminal connected to the first node and the other terminal connected to the signal output terminal.

9. A gate driving circuit comprising at least two cascaded stages of shift register unit according to claim 1, wherein
a signal input terminal of the shift register unit in a first stage is connected to an initial signal terminal; and
except the shift register unit in the first stage, a signal output terminal of the shift register unit in a previous stage is connected to a signal input terminal of the shift register unit in a next stage.

10. A display device comprising the gate driving circuit according to claim 9.

11. A driving method for driving the shift register unit according to claim 1, wherein within one image frame, the driving method comprises:
in a first phase, outputting the voltage at the signal input terminal to the first node by the input module under control of the first clock signal terminal, meanwhile storing the voltage at the first node by the energy storage module, storing the voltage at the first voltage terminal by the first pull-up control module, and outputting the voltage at the second voltage terminal to the pull-up control node by the second pull-up control module under the control of the first node;

in a second phase, outputting the voltage stored by the energy storage module in the first phase to the pull-down control node by the pull-down control module under control of the second clock signal terminal, outputting the voltage at the first voltage terminal to the signal output terminal by the pull-down module under control of the pull-down control node, and meanwhile storing the voltage at the pull-down control node;

in a third phase, outputting the voltage at the signal input terminal to the first node by the input module under control of the first clock signal terminal, storing the voltage at the first node by the energy storage module voltage, storing the voltage at the first clock signal terminal by the first pull-up voltage control module, the pull-down module being kept in a turned-on state through the voltage stored in the second stage and outputting the voltage at the second voltage terminal to the signal output terminal;

in a fourth phase, outputting the voltage at the first voltage terminal to the pull-up control node by the first pull-up control module through the voltage stored in the third phase under control of the first clock signal terminal, the second clock signal terminal and the first node so that the pull-up module outputs the voltage at the second voltage terminal to the signal output terminal and the voltage at the pull-up control node is stored, outputting the voltage stored in the third phase to the first node by the energy storage module, outputting the voltage at the first node to the pull-down control node by the pull-down control module and storing the voltage at the pull-down control node;

sequentially repeating control signals of the signal input terminal, the first clock signal terminal and the second clock signal terminal in the third phase and the fourth phase so as to keep the signal output terminal outputting the voltage at the second voltage terminal;

in a fifth phase, outputting the voltage at the signal input terminal to the first node by the input module under control of the first clock signal terminal, meanwhile storing the voltage at the first node by the energy storage module, storing the voltage at the first clock signal terminal by the first pull-up control module, outputting the voltage at the second voltage terminal to the pull-up control node by the second pull-up control module under control of the first node, keeping the signal output terminal outputting the voltage at the second voltage terminal under an action of self-capacitance of signal lines;

in a sixth phase, outputting the voltage stored by the energy storage module in the first phase to the pull-down control node by the pull-down control module under the control of the second clock signal terminal, and outputting the voltage at the first voltage terminal to the signal output terminal by the pull-down module under the control of the pull-down control node, and meanwhile storing the voltage at the pull-down control node; and before a next image frame, repeating control signals of the signal input terminal, the first clock signal terminal and the second clock signal terminal in the fifth phase and the sixth phase so as to keep the signal output terminal outputting the voltage at the first voltage terminal.

12. The gate driving circuit according to claim 9, wherein in its each stage of shift register unit, the first pull-up control module comprises:
   a first transistor having a gate connected to the first clock signal, and a first electrode connected to the first voltage terminal;
   a second transistor having a gate connected to a second electrode of the first transistor, and a first electrode connected to the first voltage terminal;
   a third transistor having a gate connected to the second clock signal terminal, a first electrode connected to a second electrode of the second transistor, and a second electrode connected to the pull-up control node;
   a fourth transistor having a gate connected to the first node, a first electrode connected to the gate of the second transistor, and a second electrode connected to the first clock signal terminal; and
   a first capacitor having one terminal connected to the gate of the second transistor and the other terminal connected to the gate of the third transistor.

13. The gate driving circuit according to claim 9, wherein in its each stage of shift register unit, the input module comprises:
   a fifth transistor having a gate connected to the first clock signal terminal, a first electrode connected to the signal input terminal, and a second electrode connected to the first node.

14. The gate driving circuit according to claim 9, wherein in its each stage of shift register unit, the second pull-up control module comprises:
   a sixth transistor having a gate connected to the first node, a first electrode connected to the second voltage terminal, and a second electrode connected to the pull-up control node.

15. The gate driving circuit according to claim 9, wherein in its each stage of shift register unit, the pull-down control module comprises:
   a seventh transistor having a gate connected to the second clock signal terminal, a first electrode connected to the first node, and a second electrode connected to the pull-down control node.

16. The gate driving circuit according to claim 9, wherein in its each stage of shift register unit, the pull-up module comprises:
   an eighth transistor having a gate connected to the pull-up control node, a first electrode connected to the second voltage terminal, and a second electrode connected to the signal output terminal; and
   a third capacitor having one terminal connected to the second voltage terminal and the other terminal connected to the gate of the eighth transistor.

17. The gate driving circuit according to claim 9, wherein in its each stage of shift register unit, the pull-down module comprises:
   a ninth transistor having a gate connected to the pull-down control node, a first electrode connected to the first voltage terminal, and a second electrode connected to the signal output terminal; and
   a fourth capacitor having one terminal connected to the gate of the ninth transistor and the other terminal connected to the second electrode of the ninth transistor.

18. The gate driving circuit according to claim 9, wherein in its each stage of shift register unit, the energy storage module comprises:

a second capacitor having one terminal connected to the first node and the other terminal connected to the signal output terminal.

19. The display device according to claim 10, wherein in each stage of shift register unit in the gate driving circuit, the first pull-up control module comprises:
- a first transistor having a gate connected to the first clock signal, and a first electrode connected to the first voltage terminal;
- a second transistor having a gate connected to a second electrode of the first transistor, and a first electrode connected to the first voltage terminal;
- a third transistor having a gate connected to the second clock signal terminal, a first electrode connected to a second electrode of the second transistor, and a second electrode connected to the pull-up control node;
- a fourth transistor having a gate connected to the first node, a first electrode connected to the gate of the second transistor, and a second electrode connected to the first clock signal terminal; and
- a first capacitor having one terminal connected to the gate of the second transistor and the other terminal connected to the gate of the third transistor.

20. The display device according to claim 10, wherein in each stage of shift register unit in the gate driving circuit, the input module comprises:
- a fifth transistor having a gate connected to the first clock signal terminal, a first electrode connected to the signal input terminal, and a second electrode connected to the first node.

* * * * *